(12) United States Patent
Maki et al.

(10) Patent No.: US 11,050,406 B2
(45) Date of Patent: Jun. 29, 2021

(54) MULTI-LAYER PIEZOELECTRIC SUBSTRATE WITH HEAT DISSIPATION

(71) Applicant: Skyworks Solutions, Inc., Irvine, CA (US)

(72) Inventors: Keiichi Maki, Suita (JP); Rei Goto, Osaka (JP); Gong Bin Tang, Moriguchi (JP); Yosuke Hamaoka, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 16/414,622

(22) Filed: May 16, 2019

(65) Prior Publication Data

US 2019/0357381 A1 Nov. 21, 2019

Related U.S. Application Data

(60) Provisional application No. 62/674,342, filed on May 21, 2018, provisional application No. 62/681,456, filed on Jun. 6, 2018.

(51) Int. Cl.
*H03H 9/02* (2006.01)
*H03H 9/64* (2006.01)
*H03H 7/54* (2006.01)

(52) U.S. Cl.
CPC .... *H03H 9/02574* (2013.01); *H03H 9/02834* (2013.01); *H03H 9/64* (2013.01); *H03H 7/54* (2013.01); *H03H 9/6413* (2013.01)

(58) Field of Classification Search
None
See application file for complete search history.

(56) References Cited

U.S. PATENT DOCUMENTS

| | | | |
|---|---|---|---|
| 4,037,176 | A | 7/1977 | Ono et al. |
| 5,446,330 | A | 8/1995 | Eda et al. |
| 6,310,423 | B1 | 10/2001 | Tanaka et al. |
| 7,105,980 | B2 | 9/2006 | Abbott et al. |
| 7,245,193 | B2 | 7/2007 | Funasaka |

(Continued)

FOREIGN PATENT DOCUMENTS

WO  WO 2017/089107  6/2017

OTHER PUBLICATIONS

Kadota, et al., "Improved Quality Factor of Hetero Acoustic Layer (HAL) SAW Resonator Combining LiTaO3 Thin Plate and Quartz Substrate," 2017 IEEE International Ultrasonics Symposium (IUS), Sep. 2017.

(Continued)

*Primary Examiner* — Steven B Gauthier
(74) *Attorney, Agent, or Firm* — Knobbe, Martens, Olson & Bear, LLP

(57) ABSTRACT

Aspects of this disclosure relate to a filter that includes an acoustic wave device with a multi-layer substrate with heat dissipation. The multi-layer substrate includes a support substrate (e.g., a quartz substrate), a piezoelectric layer, an interdigital transducer electrode on the piezoelectric layer, and a thermally conductive layer configured to dissipate heat associated with the acoustic wave device. The thermally conductive layer is disposed between the support substrate and the piezoelectric layer. The thermally conductive layer has a thickness that is greater than 10 nanometers and less than a thickness of the piezoelectric layer.

20 Claims, 11 Drawing Sheets

(56) References Cited

U.S. PATENT DOCUMENTS

| | | |
|---|---|---|
| 7,331,092 B2 | 2/2008 | Miura et al. |
| 7,800,464 B2 | 9/2010 | Tajima et al. |
| 7,911,111 B2 | 3/2011 | Suzuki et al. |
| 8,384,268 B2 | 2/2013 | Kadota |
| 9,438,201 B2 | 9/2016 | Hori et al. |
| 9,929,769 B1 | 3/2018 | Guyette et al. |
| 2004/0032706 A1 | 2/2004 | Kemmochi et al. |
| 2007/0182279 A1 | 8/2007 | Kawano et al. |
| 2009/0224851 A1 | 9/2009 | Feiertag et al. |
| 2014/0118092 A1 | 5/2014 | Burak et al. |
| 2014/0292149 A1 | 10/2014 | Zou et al. |
| 2015/0069882 A1 | 3/2015 | Umeda et al. |
| 2016/0261248 A1 | 9/2016 | Grousset et al. |
| 2017/0063336 A1 | 3/2017 | Costa et al. |
| 2017/0093371 A1 | 3/2017 | Takamine |
| 2017/0222622 A1 | 8/2017 | Solal et al. |
| 2019/0036009 A1* | 1/2019 | Tai .......................... H01L 41/39 |
| 2019/0074819 A1 | 3/2019 | Goto et al. |
| 2019/0260347 A1* | 8/2019 | Takai ................. H03H 9/02086 |

OTHER PUBLICATIONS

International Search Report dated Sep. 5, 2019 for International Patent Application No. PCT/US2019/032706, 4 pages.

Written Opinion of the International Searching Authority dated Sep. 5, 2019 for International Patent Application No. PCT/US2019/032706, 7 pages.

Wikipedia contributors, "Surface acoustic wave sensor," Wikipedia, The Free Encyclopedia. Available at: Wikipedia, https://en.wikipedia.org/wiki/Surface_acoustic_wave_sensor (accessed: Sep. 14, 2020).

Kirschner, Jared, "Surface Acoustic Wave Sensors (SAWS): Design for Application," Microelectromechanical Systems, Dec. 6, 2010.

Blick, Robert, et al., "Chapter 28—Surface Acoustic Waves and Nano-Electromechanical Systems," from Acoustic Waves—From Microdevices to Helioseismology, 2011.

Roditi International Corp., Lithium Niobate Properties, copyright 2004, available at: http://www.roditi.com/SingleCrystal/LiNbO3/liNBO3-Properties.html (accessed on Feb. 10, 2021).

Roditi International Corp., Lithium Tantalate Properties, copyright 2004, available at: http://www.roditi.com/SingleCrystal/Lithium-Tantalate/LiTaO3-Properties.html (accessed on Feb. 10, 2021).

* cited by examiner

H1=100μm
H2=100μm
H3=0nm

MAX SURFACE TEMP=83.5 °C

MAX: 83.550 °C
MIN: 26.681 °C

H1=100μm
H2=100μm
H3=30nm

MAX SURFACE TEMP=52.2 °C

MAX: 52.185 °C
MIN: 27.069 °C

MULTI-LAYER PIEZOELECTRIC SUBSTRATE WITH HEAT DISSIPATION

CROSS REFERENCE TO PRIORITY APPLICATIONS

This application claims the benefit of priority of U.S. Provisional Patent Application No. 62/674,342, filed May 21, 2018 and titled "TEMPERATURE COMPENSATED MULTI-LAYER PIEZOELECTRIC SUBSTRATE," and U.S. Provisional Patent Application No. 62/681,456, filed Jun. 6, 2018 and titled "TEMPERATURE COMPENSATED MULTI-LAYER PIEZOELECTRIC SUBSTRATE," the disclosures of each of which are hereby incorporated by reference in their entireties herein.

BACKGROUND

Technical Field

Embodiments of this disclosure relate to surface acoustic wave devices.

Description of Related Technology

Acoustic wave filters can be implemented in radio frequency electronic systems. For instance, filters in a radio frequency front end of a mobile phone can include acoustic wave filters. An acoustic wave filter can be a band pass filter. A plurality of acoustic wave filters can be arranged as a multiplexer. For example, two acoustic wave filters can be arranged as a duplexer.

A surface acoustic wave filter can include a plurality of resonators arranged to filter a radio frequency signal. Each resonator can include a surface acoustic wave device. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed. Filtering signals having relatively high power levels with surface acoustic wave resonators can generate heat.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a filter with a multi-layer substrate with heat dissipation. The filter includes an acoustic wave device. The filter is arranged as a band pass filter configured to filter a radio frequency signal. The acoustic wave device includes a support substrate, a piezoelectric layer, an interdigital transducer electrode on the piezoelectric layer, and a thermally conductive layer configured to dissipate heat associated with the acoustic wave device. The thermally conductive layer has a higher thermal conductivity than the support substrate. The thermally conductive layer is disposed between the support substrate and the piezoelectric layer. The thermally conductive layer has a thickness that is greater than 10 nanometers and less than a thickness of the piezoelectric layer.

The support substrate can be a quartz substrate. The support substrate can include at least one of silicon, aluminum nitride, silicon nitride, magnesium oxide spinel, magnesium oxide crystal, or diamond. The piezoelectric layer can have a higher thermal conductivity than the support substrate.

The acoustic wave device is configured to generate an acoustic wave having a wavelength of $\lambda$, and the thickness of the thermally conductive layer can be less than $0.03\lambda$. The thickness of the thermally conductive layer can be less than half of the thickness of the piezoelectric layer.

The acoustic wave device can further include a temperature compensating layer having a positive temperature coefficient of frequency, in which the temperature compensating layer is disposed between the piezoelectric layer and the support substrate. The temperature compensating layer can be a silicon dioxide layer. The temperature compensating layer can be disposed between the piezoelectric layer and the thermally conductive layer. The temperature compensating layer can be disposed between the thermally conductive layer and the support substrate. The temperature compensating layer can be disposed on an opposite side of the piezoelectric layer than the interdigital transducer electrode.

The acoustic wave device can include a first temperature compensating layer disposed between the piezoelectric layer and the thermally conductive layer, and a second temperature compensating layer disposed between the thermally conductive layer and the quartz substrate.

The thermally conductive layer can include a metal. The thermally conductive layer can include aluminum in certain applications. The thermally conductive layer can have a thermal conductivity that is at least 10 times a thermal conductivity of the piezoelectric layer. The piezoelectric layer can be a lithium tantalate layer. The thermally conductive layer can have a thermal conductivity in a range from 140 W/mK to 425 W/mK.

The filter can be arranged such that a maximum surface temperature of a filter chip that includes the filter is less than 60° Celsius during operation of the filter.

Another aspect of this disclosure is a surface acoustic wave device with a temperature compensated multi-layer substrate. The surface acoustic wave device includes a support substrate, a piezoelectric layer, an interdigital transducer electrode on the piezoelectric layer, a thermally conductive layer configured to dissipate heat associated with the surface acoustic wave device, and a temperature compensating layer having a positive temperature coefficient of frequency. The thermally conductive layer has a higher thermal conductive than the support substrate. The thermally conductive layer is disposed between the quartz substrate and the piezoelectric layer. The thermally conductive layer has a thickness that is greater than 10 nanometers and less than a thickness of the piezoelectric layer. The temperature compensating layer and the interdigital transducer electrode are disposed on opposite sides of the piezoelectric layer.

In certain embodiments, the piezoelectric layer is a lithium tantalate layer and the support substrate is a quartz layer. The surface acoustic wave device is configured to generate a surface acoustic wave having a wavelength of $\lambda$. In certain embodiments, the thickness of the thermally conductive layer is less than $0.03\lambda$.

The temperature compensating layer can be a silicon dioxide layer. The temperature compensating layer can be disposed between the piezoelectric layer and the support substrate. The temperature compensating layer can be disposed between the thermally conductive layer and the piezoelectric layer. The surface acoustic wave device can include temperature compensating layers on opposing sides of the thermally conductive layer.

The thermally conductive layer can include a metal. The thermally conductive layer can have a thermal conductivity that is at least 10 times a thermal conductivity of the piezoelectric layer. The thermally conductive layer can have a thermal conductivity in a range from 60 W/mK to 425 W/mK. The thermally conductive layer can have a thermal conductivity in a range from 140 W/mK to 300 W/mK.

Another aspect of this disclosure is a filter with a temperature compensated multi-layer substrate. The filter is arranged as a band pass filter configured to filter a radio frequency signal. The filter includes an acoustic wave device. The acoustic wave device includes a quartz substrate, a piezoelectric layer, an interdigital transducer electrode on the piezoelectric layer, and a thermally conductive layer configured to dissipate heat associated with the acoustic wave device. The thermally conductive layer is disposed between the quartz substrate and the piezoelectric layer. The thermally conductive layer has a thickness that is greater than 10 nanometers and less than a thickness of the piezoelectric layer.

The acoustic wave device can further include a temperature compensating layer having a positive temperature coefficient of frequency, in which the temperature compensating layer is disposed between the piezoelectric layer and the quartz substrate. The temperature compensating layer can be a silicon dioxide layer. The temperature compensating layer can be disposed between the piezoelectric layer and the thermally conductive layer. The temperature compensating layer can be disposed between the thermally conductive layer and the quartz substrate. The temperature compensating layer can be disposed on an opposite side of the piezoelectric layer than the interdigital transducer electrode.

The acoustic wave device can include a first temperature compensating layer disposed between the piezoelectric layer and the thermally conductive layer, and a second temperature compensating layer disposed between the thermally conductive layer and the quartz substrate.

The acoustic wave device is configured to generate an acoustic wave having a wavelength of $\lambda$, and the thickness of the thermally conductive layer can be less than $0.03\lambda$. The thickness of the thermally conductive layer can be less than half of the thickness of the piezoelectric layer.

The thermally conductive layer can include a metal. The thermally conductive layer can have a thermal conductivity that is at least 10 times a thermal conductivity of the piezoelectric layer. The thermally conductive layer can have a thermal conductivity in a range from 60 W/mK to 425 W/mK. The thermally conductive layer can have a thermal conductivity in a range from 140 W/mK to 300 W/mK.

The thermally conductive layer can be in physical contact with the piezoelectric layer. The piezoelectric layer can be a lithium tantalate layer. The piezoelectric layer can be a lithium niobate layer.

The filter can be arranged such that a maximum surface temperature of a filter chip that includes the filter is less than 60° Celsius during operation of the filter.

Another aspect of this disclosure is a surface acoustic wave device with a temperature compensated multi-layer substrate. The surface acoustic wave device includes a quartz substrate, a piezoelectric layer, an interdigital transducer electrode on the piezoelectric layer, a thermally conductive layer configured to dissipate heat associated with the surface acoustic wave device, and a temperature compensating layer having a positive temperature coefficient of frequency. The thermally conductive layer is disposed between the quartz substrate and the piezoelectric layer. The thermally conductive layer has a thickness that is greater than 10 nanometers and less than a thickness of the piezoelectric layer. The temperature compensating layer and the interdigital transducer electrode are disposed on opposite sides of the piezoelectric layer.

The temperature compensating layer can be a silicon dioxide layer. The temperature compensating layer can be disposed between the piezoelectric layer and the quartz substrate. The temperature compensating layer can be disposed between the thermally conductive layer and the piezoelectric layer.

The surface acoustic wave device can include a second temperature compensating layer disposed between the thermally conductive layer and the quartz substrate.

The surface acoustic wave device is configured to generate a surface acoustic wave having a wavelength of $\lambda$, and the thickness of the thermally conductive layer can be less than $0.03\lambda$.

The thermally conductive layer can include a metal. The thermally conductive layer can have a thermal conductivity that is at least 10 times a thermal conductivity of the piezoelectric layer. The thermally conductive layer can have a thermal conductivity in a range from 60 W/mK to 425 W/mK. The thermally conductive layer can have a thermal conductivity in a range from 140 W/mK to 300 W/mK.

The piezoelectric layer can be a lithium tantalate layer. The piezoelectric layer can include lithium. The piezoelectric layer can be a synthetic crystal layer.

Another aspect of this disclosure is a radio frequency module that includes a radio frequency switch configured to pass a radio frequency signal, a surface acoustic wave filter configured to filter the radio frequency signal, and a package enclosing the surface acoustic wave filter and the radio frequency switch. The surface acoustic wave filter includes a support substrate (for example, a quartz substrate), a piezoelectric layer, and a thermally conductive layer configured to dissipate heat associated with the acoustic wave device. The thermally conductive layer is disposed between the support substrate and the piezoelectric layer.

The radio frequency module can further include a power amplifier configured to generate the radio frequency signal, in which the power amplifier is enclosed within the package. The radio frequency module can include any suitable features of the filters and/or surface acoustic wave devices discussed herein.

Another aspect of this disclosure is a wireless communication device that includes a surface acoustic wave filter configured to provide a filtered radio frequency signal and an antenna configured to transmit the filtered radio frequency signal. The surface acoustic wave filter includes a support substrate (for example, a quartz substrate), a piezoelectric layer, and a thermally conductive layer configured to dissipate heat associated with the acoustic wave device. The thermally conductive layer is disposed between the support substrate and the piezoelectric layer.

The wireless communication device can be a mobile phone. The wireless communication device can further include an antenna switch coupled between the surface acoustic wave filter and the antenna. The wireless communication device can include a transceiver in communication with a radio frequency front end, in which the radio frequency front end includes the surface acoustic wave device. The wireless communication device can include a baseband processor in communication with the transceiver.

The wireless communication device can include any suitable features of the filters and/or surface acoustic wave devices and/or radio frequency modules discussed herein.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
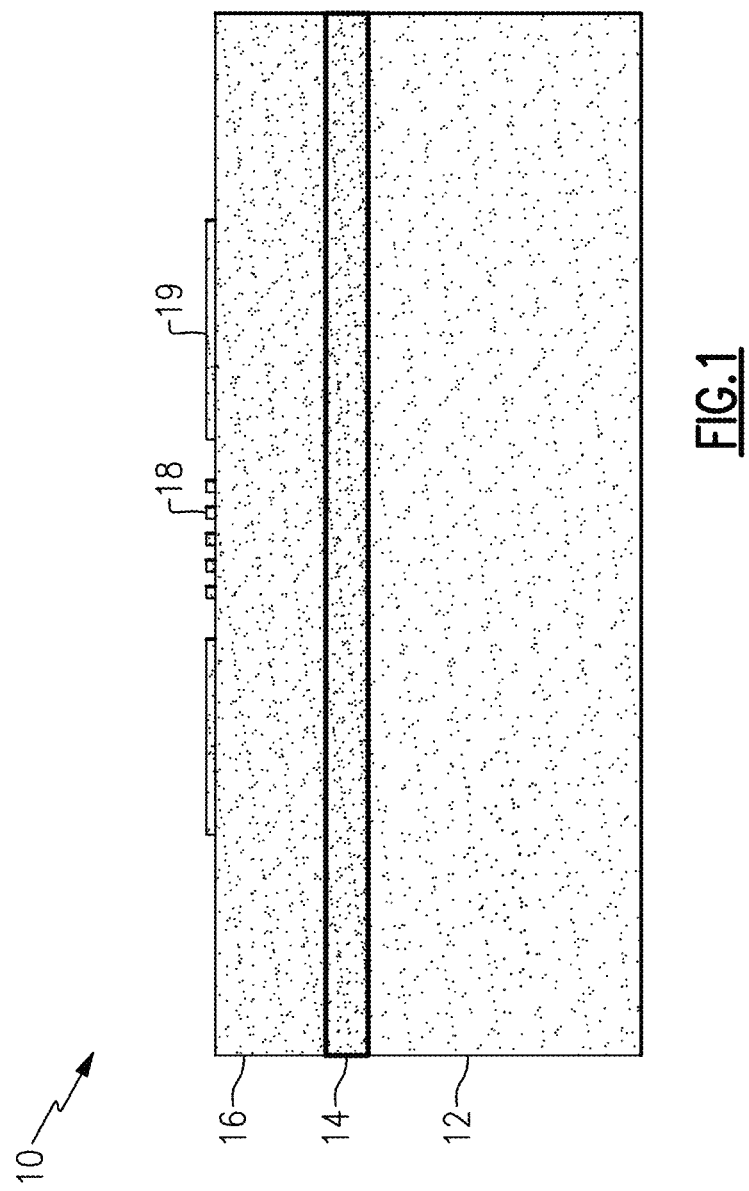
FIG. 1 illustrates a cross section of a surface acoustic wave device with a multi-layer piezoelectric substrate with heat dissipation according to an embodiment.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

A higher quality factor (Q) and a temperature coefficient of frequency (TCF) closer to zero can be desirable in acoustic wave devices. A surface acoustic wave resonator that includes quartz crystal bonded with a lithium tantalate ($LiTaO_3$) piezoelectric layer can achieve a relatively high Q and a TCF that is relatively close to zero. A surface acoustic wave device with a lithium tantalate substrate bonded with a quartz crystal can experience undesirable self-heating due to the thermal conductivity of the quartz crystal being lower than the thermal conductivity of lithium tantalate. The thermal conductivity of a lithium niobate ($LiNbO_3$) or a lithium tantalate piezoelectric layer of a surface acoustic wave device can present challenges related to self-heating in a surface acoustic wave device. This disclosure provides technical solutions to such self-heating.

Aspects of this disclosure relate to an acoustic wave resonator that includes a thermally conductive layer between a support substrate (e.g., a quartz crystal substrate) and a piezoelectric substrate (e.g., a lithium tantalate substrate). The thermally conductive layer can improve one or more of substrate adhesion, heat dissipation, and electric characteristics relative to a similar device without the thermally conductive layer. The thermally conductive layer can be a layer of material having a thermal conductivity that is higher than the thermal conductivity of the support substrate. Thermal conductivity comparisons herein can be for different materials at the same temperature. The thermally conductive layer can be sufficiently thick to dissipate heat from self-heating. The thermally conductive layer can also be relatively thin. The acoustic wave resonator is an acoustic wave device. The acoustic wave resonator can be included in a band pass filter configured to filter a radio frequency (RF) signal.

FIG. 1 illustrates a cross section of a surface acoustic wave device 10 with a multi-layer piezoelectric substrate with heat dissipation according to an embodiment. The illustrated surface acoustic wave device 10 includes a support substrate 12, a thermally conductive layer 14, a piezoelectric layer 16, an interdigital transducer (IDT) electrode 18, and reflective gratings 19. The thermally conductive layer 14 can dissipate heat associated with the surface acoustic wave device 10. Self-heating of the acoustic wave device 10 is reduced by including the thermally conductive layer 14. Accordingly, the surface acoustic wave device 10 includes a multi-layer piezoelectric substrate with heat dissipation. The thermally conductive layer 14 can improve adherence between the layers of the surface acoustic wave device 10. Electrical performance of the surface acoustic wave device 10 can improve with the thermally conductive layer 14.

The support substrate 12 can be a quartz substrate. A quartz support substrate can contribute to the surface acoustic wave device 10 achieving a relatively high Q. The support substrate 12 can be a silicon (Si) substrate, an aluminum nitride (AlN) substrate, a silicon nitride (SiN) substrate, a magnesium oxide (MgO) spinel substrate, a magnesium oxide crystal substrate, a diamond substrate, or the like. The support substrate 12 can have a relatively high impedance. The support substrate 12 can have a lower thermal conductivity than the thermally conductive layer 14. The thermal conductivity of the support substrate 12 can be lower than the thermal conductivity of the piezoelectric layer 16. For example, the support substrate 12 can be quartz and the piezoelectric layer 16 can be lithium tantalate and quartz has a lower thermal conductivity than lithium tantalate. The support substrate 12 can be bonded with the thermally conductive layer 14. The support substrate 12 can be in physical contact with the thermally conductive layer 14 as illustrated.

The surface acoustic wave device 10 includes a thermally conductive layer 14 disposed between the support substrate 12 and the piezoelectric layer 16. In the surface acoustic wave device 10, the thermally conductive layer 14 and the IDT electrode 18 are on opposite sides of the piezoelectric layer 16.

The thermally conductive layer 14 has a higher thermal conductivity than the piezoelectric layer 16. In certain applications, the thermal conductivity of the thermally conductive layer 14 is at least 10 times a thermal conductivity of the piezoelectric layer 16. The thermally conductive layer 14 can have a thermal conductivity in a range from 60 W/mK to 425 W/mK. In certain applications, the thermally conductive layer 14 can have a thermal conductivity in a range from 140 W/mK to 300 W/mK. In some applications, the thermally conductive layer 14 can have a thermal conductivity in a range from 140 W/mK to 425 W/mK. The thermally conductive layer 14 can include a metal. For example, the thermally conductive layer 14 can include aluminum (Al), silver (Ag), gold (Au), copper (Cu), tungsten (W), titanium (Ti), nickel (Ni), iron (Fe), the like, or any suitable combination thereof. As one example, the thermally conductive layer 14 can be an aluminum layer. In certain applications, the thermally conductive layer 14 can be a layer of any of the following materials: silicon nitride (SiN), aluminum nitride (AlN), titanium nitride (TiN), siliconoxynitride (SiON), tantalum silicon dioxide (TaSiO$_2$), a metal compound including titanium (Ti), or a metal compound including stainless steel (e.g., by using an ion gun surface activation bonding process). The material of the thermally conductive layer 14 can be selected based on its thermal dispersion and/or electrical performance of a surface acoustic wave device that includes such a thermally conductive layer of the material.

The piezoelectric layer 16 can be any suitable piezoelectric layer. The piezoelectric layer 16 is a lithium tantalate layer in certain applications. The piezoelectric layer 16 can be a lithium niobate layer in some instances. Accordingly, the piezoelectric layer 16 can be a lithium based piezoelectric layer. The piezoelectric layer 16 can be a synthetic crystal layer.

The IDT electrode 18 is disposed on piezoelectric layer 16. The IDT electrode 18 can have a pitch that sets the wavelength λ of a surface acoustic wave generated by the surface acoustic wave device 10. The IDT electrode 18 can be an aluminum IDT electrode. IDT electrode material can include aluminum (Al), titanium (Ti), gold (Au), silver (Ag), copper (Cu), platinum (Pt), tungsten (W), molybdenum (Mo), ruthenium (Ru), or any suitable combination thereof. In some instances, the IDT electrode 18 can be a multi-layer IDT electrode. For instance, the IDT electrode 16 can include aluminum and molybdenum in certain applications.

The surface acoustic wave device 10 includes reflective gratings 19 on the piezoelectric layer 16. As illustrated, the reflective gratings 19 are arranged to reflect acoustic energy. Accordingly, the gratings can be referred to as acoustic reflectors. The reflective gratings 19 can include a plurality of periodically distributed relatively thin metal strips. The metal strips of one or more of the gratings 19 can be electrically connected in parallel with each other. Because these metal strips are part of the acoustically active area of a surface acoustic wave filter, the electrode geometry can be precisely controlled.

Figure 2A:
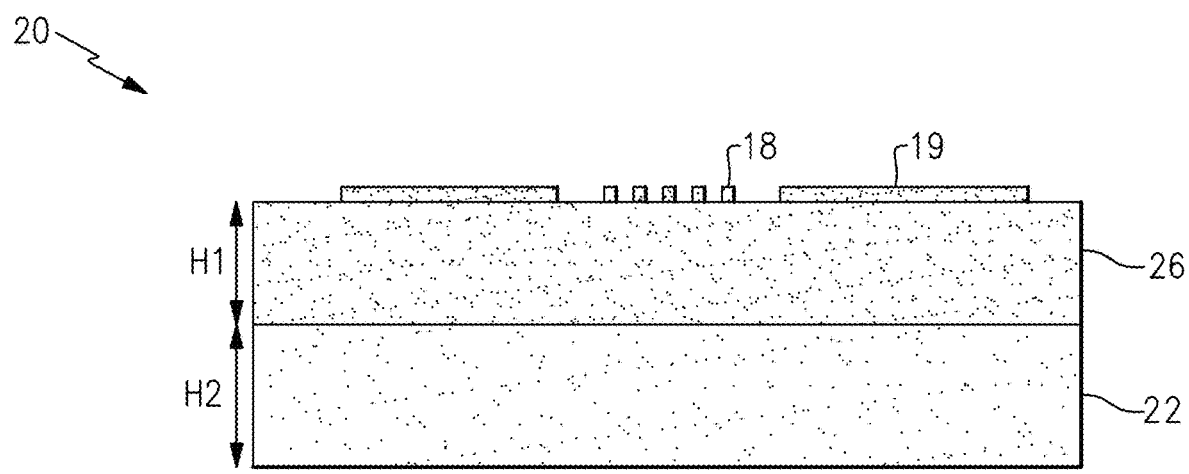
FIG. 2A illustrates a cross section of a baseline surface acoustic wave device.

FIG. 2A illustrates a cross section of a baseline surface acoustic wave device 20. The baseline surface acoustic wave device 20 includes a quartz substrate 22 having a thickness of H$_2$, a lithium tantalate layer 26 having a thickness of H$_1$, an interdigital IDT electrode 18 on the lithium tantalate layer 26, and reflective gratings 19 on the lithium tantalate layer 26. The quartz substrate 22 and the lithium tantalate layer 26 are bonded with each other and in physical contact with each other in the surface acoustic wave device 20.

Figure 2B:
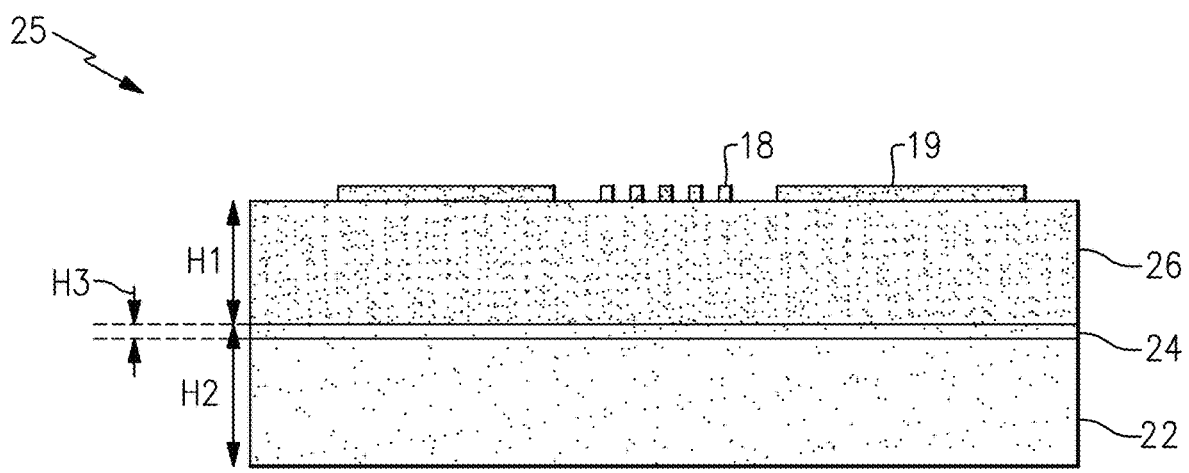
FIG. 2B illustrates a cross section of a surface acoustic wave device with a multi-layer piezoelectric substrate with heat dissipation according to an embodiment.

FIG. 2B illustrates a cross section of a surface acoustic wave device 25 with a multi-layer piezoelectric substrate with heat dissipation according to an embodiment. The surface acoustic wave device 25 includes a quartz substrate 22 having a thickness of H$_2$, a lithium tantalate layer 26 having a thickness of H$_1$, an aluminum layer 24 having a thickness of H$_3$, an interdigital IDT electrode 18 on the lithium tantalate layer 26, and reflective gratings 19 on the lithium tantalate layer 26. The quartz substrate 22 is an example of the support substrate 12 of FIG. 1. The aluminum layer 24 is an example of the thermally conductive layer 14 of FIG. 1. The lithium tantalate layer 26 is an example of the piezoelectric layer 16 of FIG. 1. In the surface acoustic wave device 25, the aluminum layer 24 is disposed between the quartz substrate 22 and the lithium tantalate layer 26. The illustrated aluminum layer 24 has a first side in physical contact with the quartz substrate 22 and a second side in physical contact with the lithium tantalate layer 26.

Figure 3A:
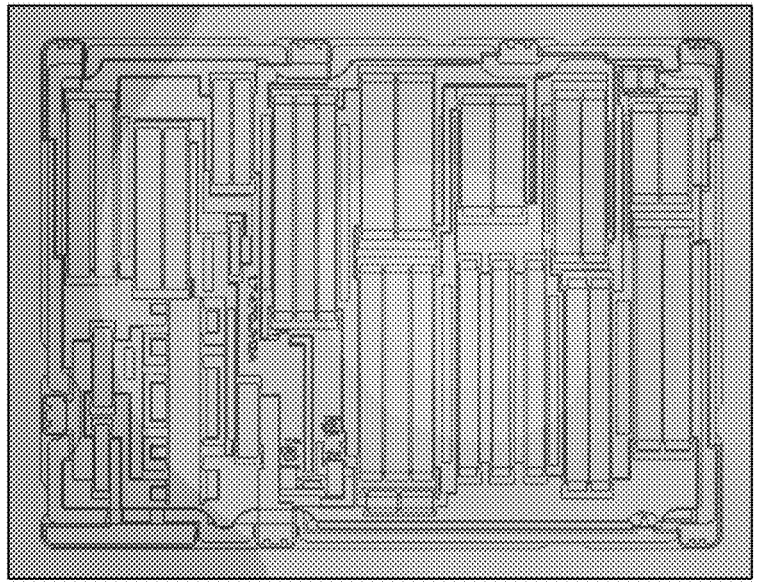
FIG. 3A illustrates a chip surface temperature distribution of the baseline surface acoustic wave device of FIG. 2A.
Figure 3A:
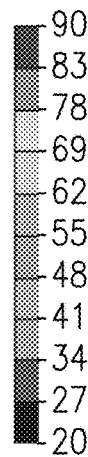

FIG. 3A illustrates a chip surface temperature distribution of the baseline surface acoustic wave device 20 of FIG. 2A. FIG. 3A indicates that a surface acoustic wave chip with a baseline surface acoustic wave device 20 with a quartz substrate 22 with a thickness H$_2$ of 100 um and a lithium tantalate layer 26 with a thickness H$_1$ of 100 um can have a maximum surface temperature of 83.5° C.

Figure 3B:
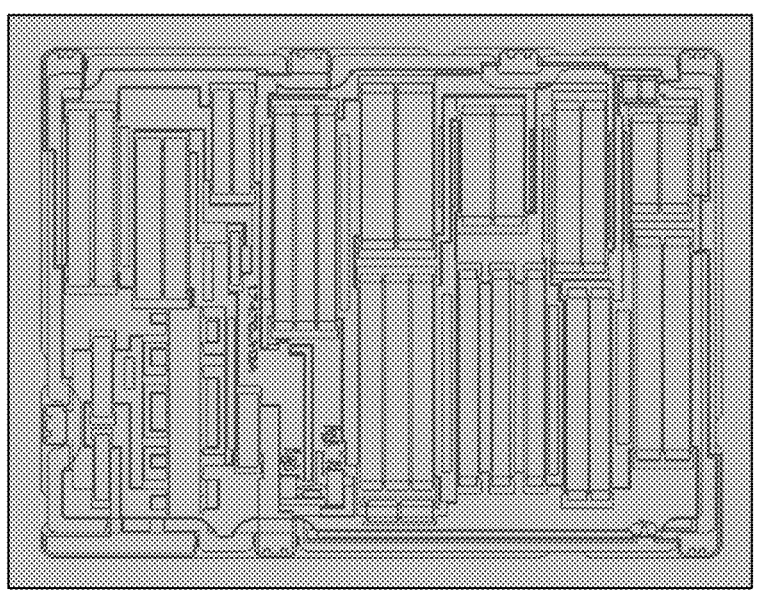
FIG. 3B illustrates a chip surface temperature distribution of the surface acoustic wave device of FIG. 2B.
Figure 3B:
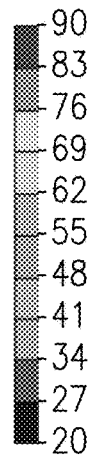

FIG. 3B illustrates a chip surface temperature distribution of the surface acoustic wave device 25 of FIG. 2B. FIG. 3B indicates that a surface acoustic wave chip with a surface acoustic wave device 25 with a quartz substrate 22 with a thickness H$_2$ of 100 um, a lithium tantalate layer 26 with a thickness H$_1$ of 100 um, and a thermally conductive layer with a thickness H$_3$ of 30 nm can have a maximum surface temperature of 52.2° C. Accordingly, FIGS. 3A and 3B indicate that including the aluminum layer 24 between the quartz substrate 22 and the lithium tantalate layer 26 can reduce surface chip temperature significantly. FIG. 3B corresponds to an embodiment of a surface acoustic wave device that can achieve a maximum surface temperature of 60° C. or less. Other suitable thermally conductive layers with a higher thermal conductivity than lithium tantalate can be implemented in place of the aluminum layer 24.

Figure 4A:
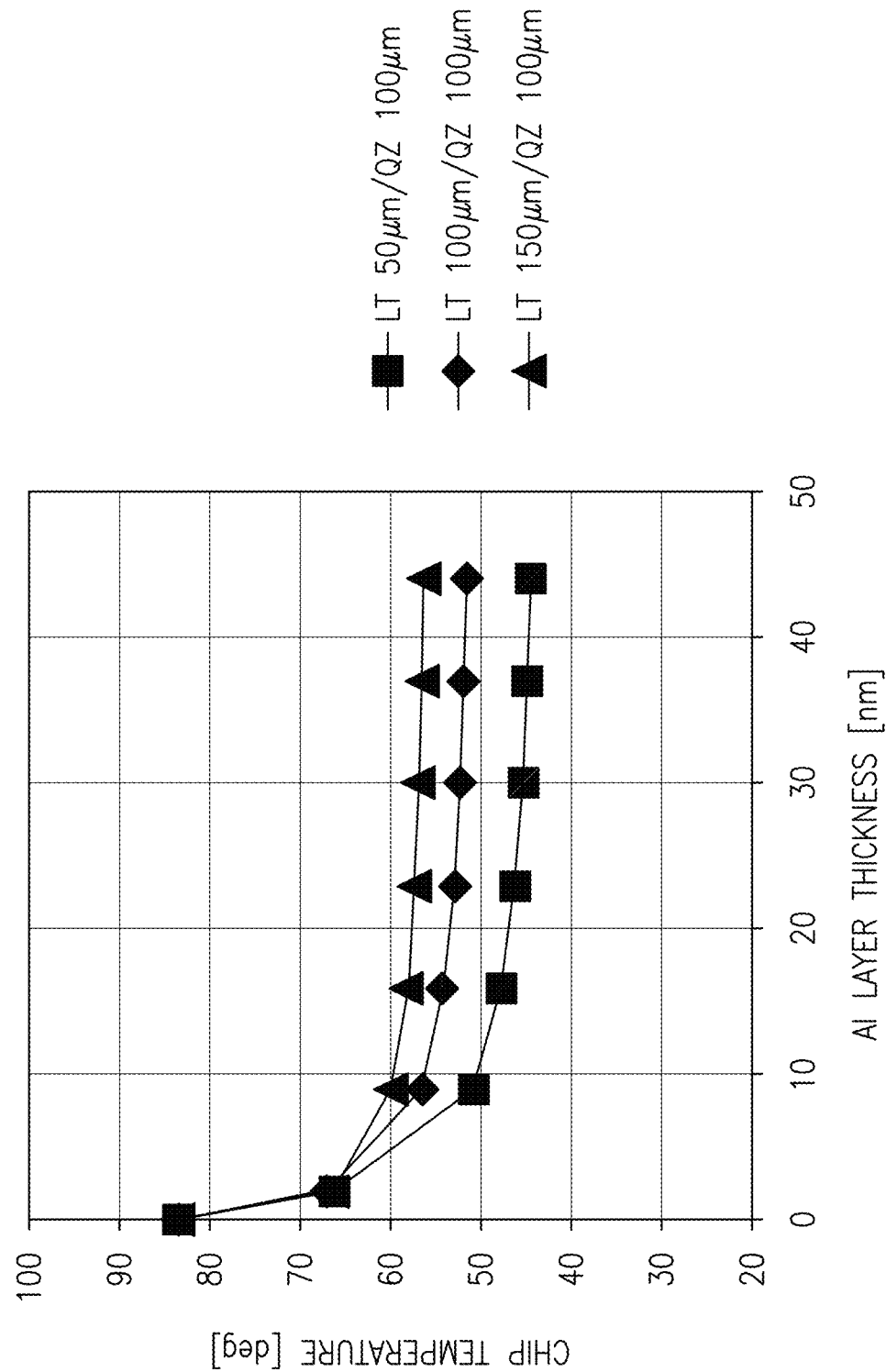
FIG. 4A is a graph with curves for chip temperature as a function of thickness of a thermally conductive layer of the surface acoustic wave device of FIG. 2B.

FIG. 4A is a graph with curves for chip temperature as a function of thickness of the aluminum layer 24 of the surface acoustic wave device 25 of FIG. 2B. Three curve are shown corresponding to different thicknesses of the lithium tantalate layer 26. These curves indicate that the chip temperature decreases more for thinner lithium tantalate layers 26. Chip temperature can generally decrease for thinner piezoelectric layers. Chip temperature can generally decrease for thicker thermally conductive layers. The impact of the thickness of the thermally conductive layer dissipating heat can be independent of a wavelength of a surface acoustic wave generated by the surface acoustic wave device 25. FIG. 4A indicates that the aluminum layer 24 of the surface acoustic wave device 25 can significantly improve thermal dissipation for thicknesses $H_3$ of at least 10 nm. With a relatively thin piezoelectric layer and a thermally conductive layer, the surface acoustic wave device 25 of FIG. 2B can have an improved power durability.

Electrical performance of a surface acoustic wave device can degrade when the thickness $H_3$ of the thermally conductive layer is too thick. Accordingly, an upper bound for the thickness $H_3$ of the thermally conductive layer can be set by the electrical performance of a surface acoustic wave device that includes the thermally conductive layer. The upper bound can be determined based on a waveform of such a surface acoustic wave device. The upper bound for the thickness $H_3$ of the thermally conductive layer can depend on the material of the thermally conductive layer.

Figure 4B:
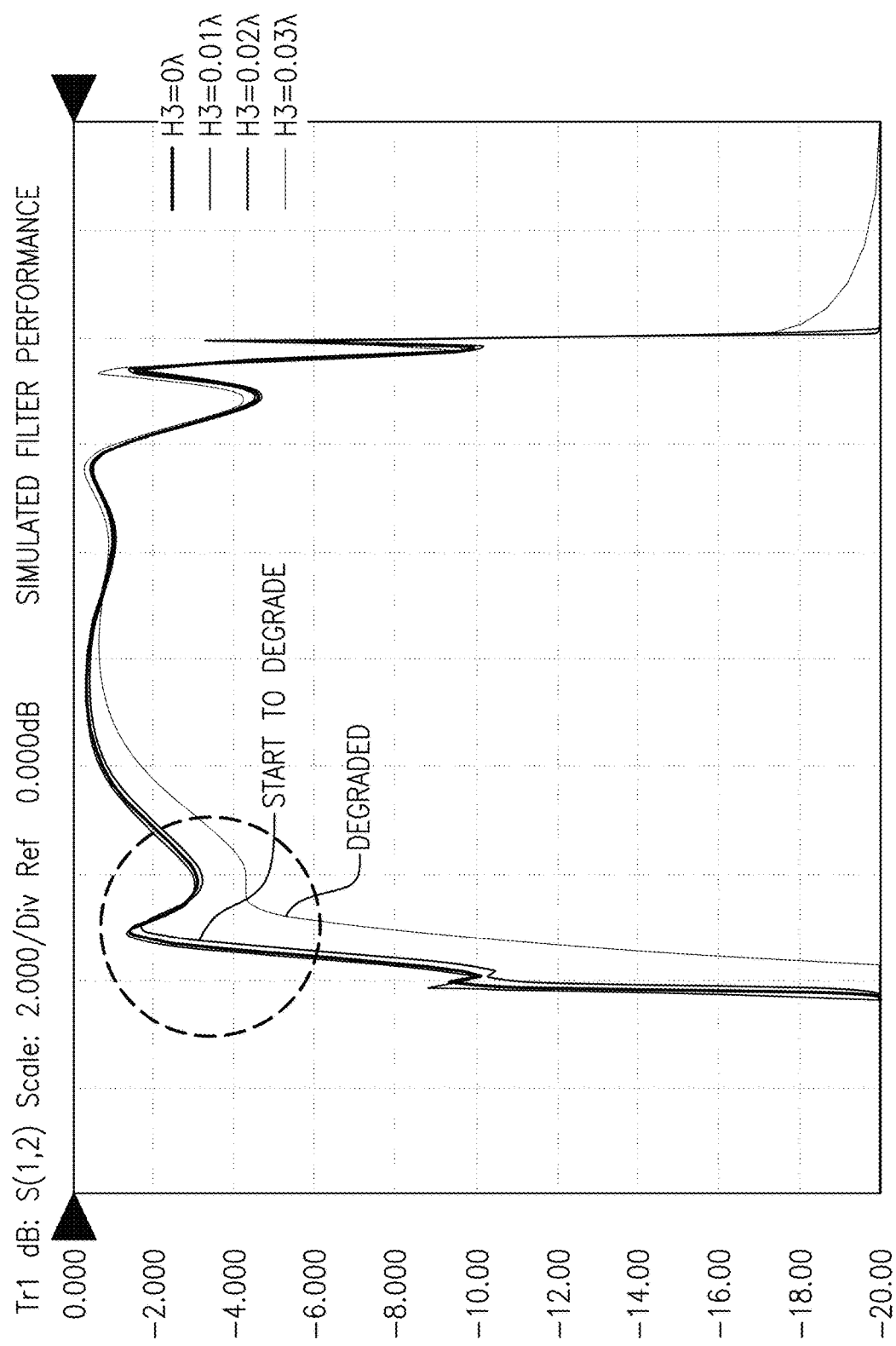
FIG. 4B is a graph with curves for simulated filter performance for various thicknesses of a thermally conductive layer of the surface acoustic wave device of FIG. 2B.

FIG. 4B is a graph with curves for simulated filter performance for various thicknesses of a thermally conductive layer of the surface acoustic wave device of FIG. 2B. The illustrated curves correspond to thermally conductive layer thicknesses $H_3$ of 0λ (no thermally conductive layer like the surface acoustic wave device 20 of FIG. 2A), 0.01λ, 0.02λ, and 0.03λ, in which λ is the wavelength of a surface acoustic wave generated by the surface acoustic wave device 25. The upper bound on the thicknesses $H_3$ of the thermally conductive layer 14 can be proportional to wavelength. As shown in FIG. 4B, the electrical performance starts to degrade for thermally conductive layer thicknesses $H_3$=0.02λ. FIG. 4B indicates that the electrical performance is degraded for thermally conductive layer thicknesses $H_3$=0.03λ. Accordingly, the thermally conductive layer thicknesses $H_3$ of the surface acoustic wave device 25 can be less than 0.03λ so that electrical performance of the surface acoustic wave device 25 is not significantly degraded. As an example, for λ=4.0 um, $H_3$ can be less than 120 nm. As another example, for λ=2.0 um, $H_3$ can be less than 60 nm.

Figure 5:
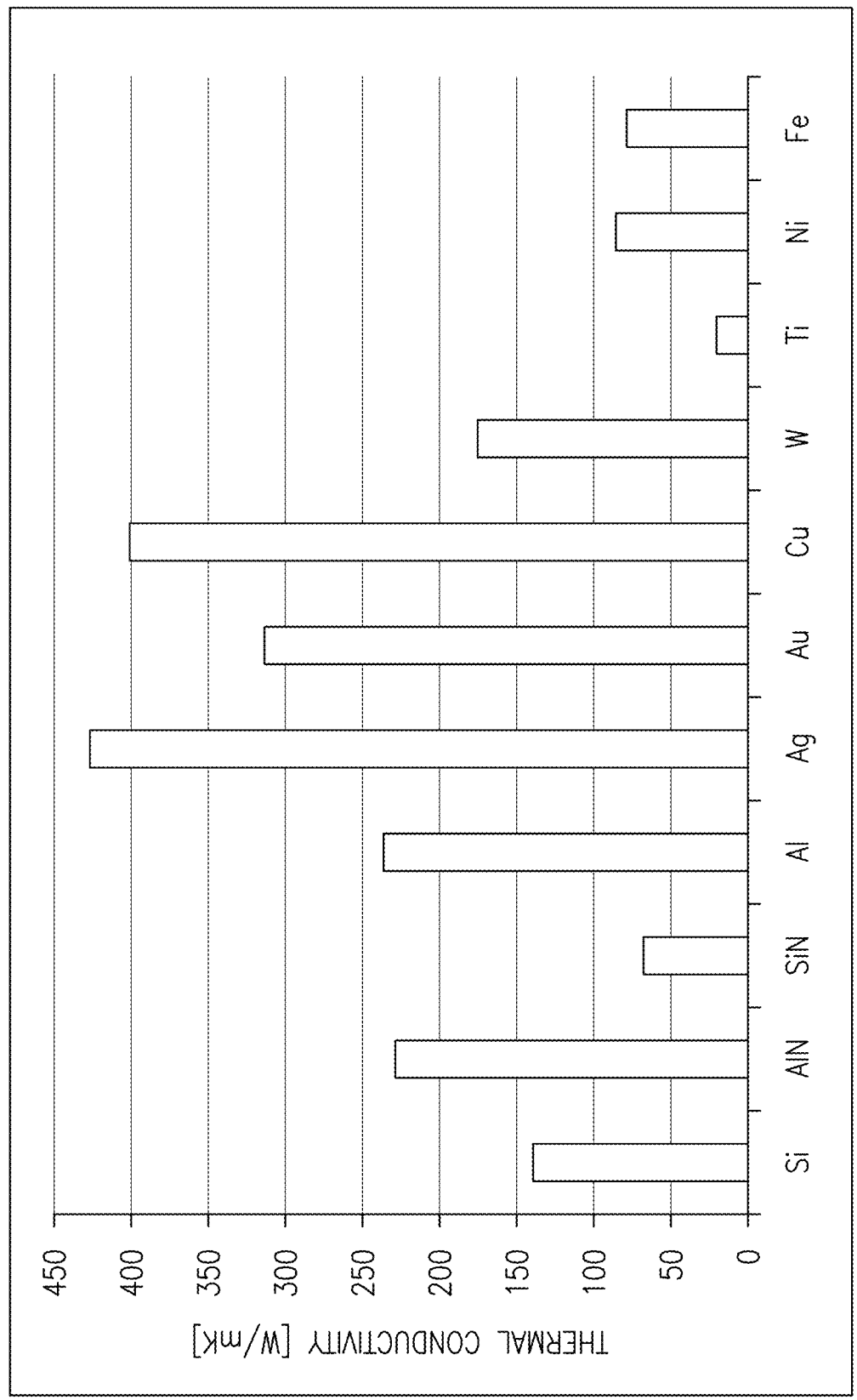
FIG. 5 is a graph that shows thermal conductivities of various materials.

FIG. 5 is a graph that shows thermal conductivities of various materials including Si, AlN, SiN, Al, Ag, Au, Cu, W, Ti, Ni, and Fe. These materials have higher thermal conductivities than lithium tantalate and lithium niobate.

Figure 6:
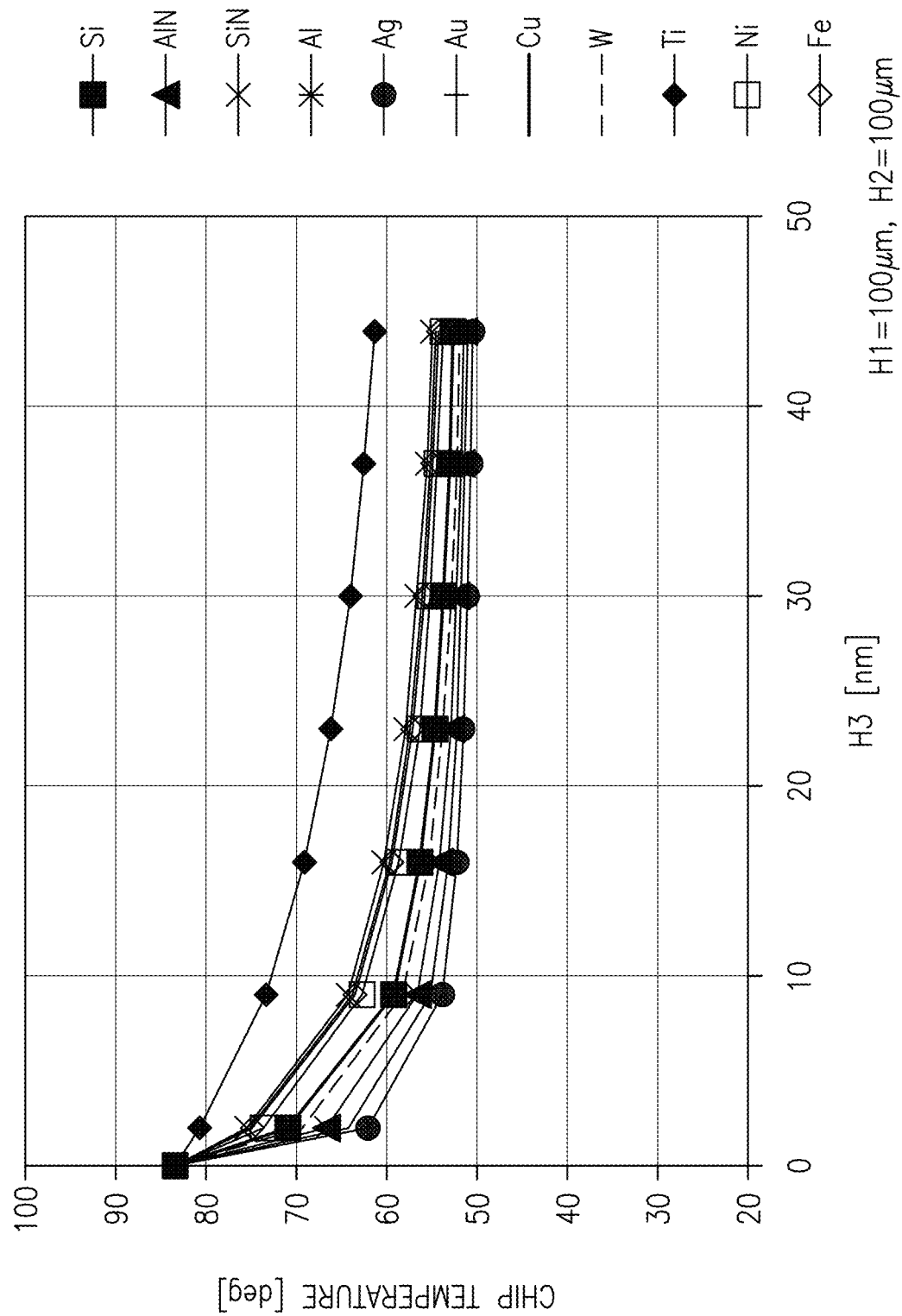
FIG. 6 is a graph with curves for chip temperature as a function of thickness for various thermally conductive layers included in place of the thermally conductive layer of a surface acoustic wave device of FIG. 2B.

FIG. 6 is a graph with curves for chip temperature as a function of thickness for various thermally conductive layers included in place of the aluminum layer 24 of the surface acoustic wave device 25 of FIG. 2B. A curve corresponding to each of the thermally conductive layer of each of the materials included in the graph of FIG. 5 is included in FIG. 6.

The thickness $H_3$ of the thermally conductive layer can be at least 10 nm. As shown in FIGS. 4A and 6, a thermally conductive layer with a thickness $H_3$ of at 10 nm can significantly reduce maximum chip temperature. The thickness $H_3$ of the thermally conductive layer can be less than 0.03λ as indicated by FIG. 4B so that the thermally conductive layer does not significantly degrade electrical performance. Accordingly, the thermally conductive layer 14 of the surface acoustic wave device 25 can have a thickness $H_3$ in a range from 10 nm to 0.03λ, in which λ is the wavelength of a surface acoustic wave generated by the surface acoustic wave device 25.

Figure 7:
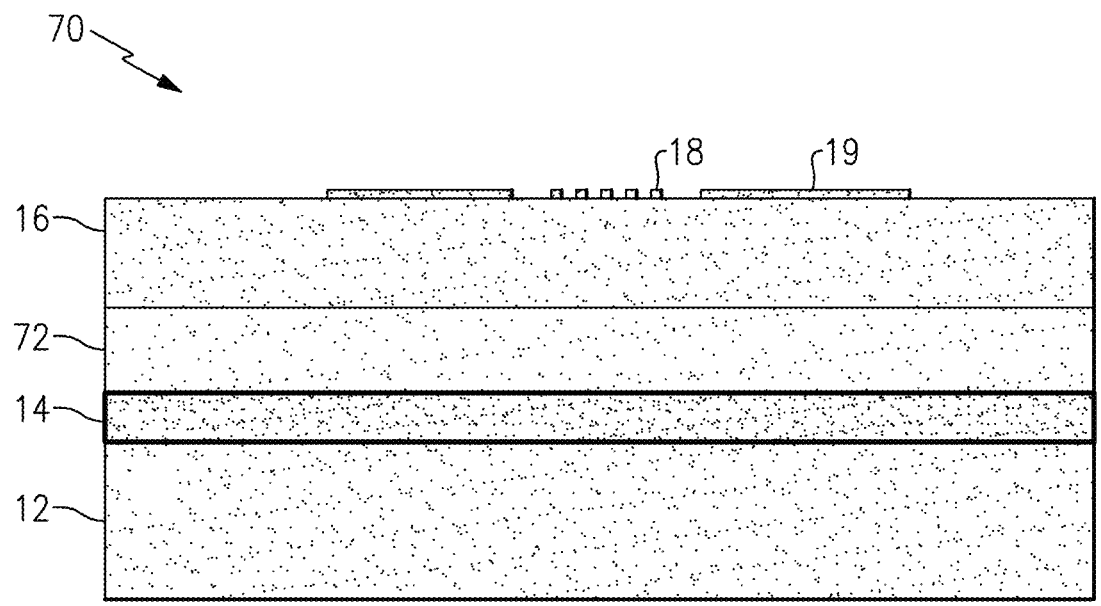
FIG. 7 illustrates a cross section of a surface acoustic wave device with a temperature compensated multi-layer piezoelectric substrate according to an embodiment.
Figure 8:
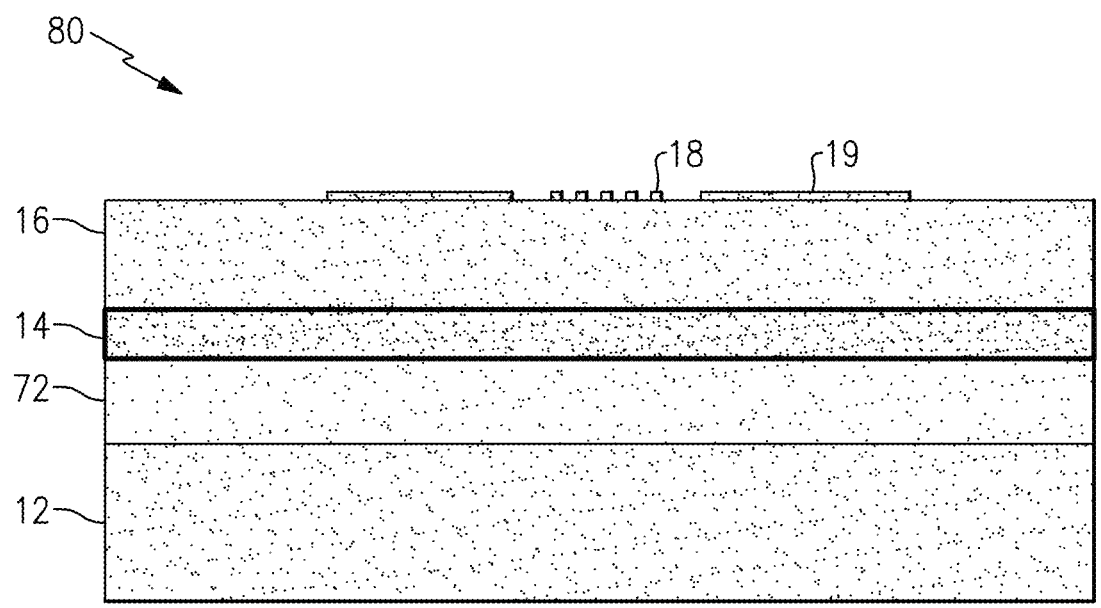
FIG. 8 illustrates a cross section of a surface acoustic wave device with a temperature compensated multi-layer piezoelectric substrate according to another embodiment.
Figure 9:
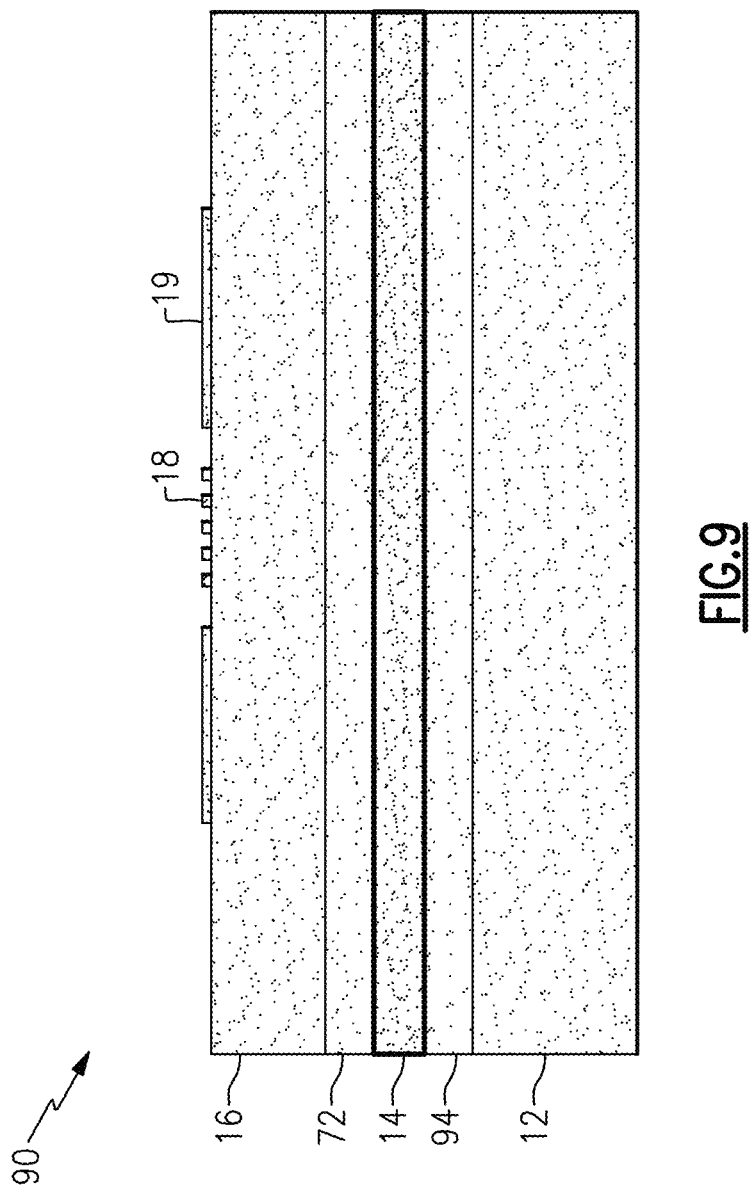
FIG. 9 illustrates a cross section of a surface acoustic wave device with a temperature compensated multi-layer piezoelectric substrate according to another embodiment.

A temperature compensating layer can be added between the piezoelectric layer and the quartz substrate of the surface acoustic wave device of FIG. 1 and/or FIG. 2B. Such a temperature compensation layer can bring the temperature coefficient of frequency (TCF) of such a surface acoustic wave device closer to zero than the surface acoustic wave device of FIG. 1 or the surface acoustic wave device of FIG. 2B. Accordingly, there can be less variation with temperature for the surface acoustic wave device with the temperature compensating layer. This can be significant in certain applications. The temperature compensation layer can have a positive TCF to compensate for a negative TCF of certain piezoelectric layers, such as lithium niobate or lithium tantalate piezoelectric layers. FIGS. 7 to 9 illustrate surface acoustic wave devices that include a temperature compensating layer in a multi-layer piezoelectric substrate with heat dissipation. In certain applications, surface acoustic wave devices of FIGS. 7 to 9 can include lithium tantalate piezoelectric layers and quartz support substrates. Any suitable principles and advantages of these surface acoustic wave devices can be combined with each other and/or with any of the other surface acoustic wave devices discussed herein.

FIG. 7 illustrates a cross section of a surface acoustic wave device 70 with a temperature compensated multi-layer piezoelectric substrate according to an embodiment. The surface acoustic wave device 70 is like the surface acoustic wave device 10 of FIG. 1, except that a temperature compensating layer 72 is included between the support substrate 12 and the piezoelectric layer 16 in the surface acoustic wave device 70. The temperature compensating layer 72 can be silicon dioxide ($SiO_2$) layer. The temperature compensating layer 72 can be a layer of any other suitable material that brings TCF closer to zero, such as a material having a positive temperature coefficient of frequency. For instance, the temperature compensating layer 72 can be a tellurium dioxide ($TeO_2$) layer or a silicon oxyfluoride (SiOF) layer. The temperature compensating layer 72 can include any suitable combination of $SiO_2$, $TeO_2$, and/or SiOF. As illustrated in FIG. 7, the temperature compensating layer 72 is disposed between the thermally conductive layer 14 and the piezoelectric layer 16. The temperature compensating layer 72 can have a first side in physical contact with the thermally conductive layer 14 and a second side in physical contact with the piezoelectric layer 16, in which the first side and the second side are opposing sides of the temperature compensating layer 72.

FIG. 8 illustrates a cross section of a surface acoustic wave device 80 with a temperature compensated multi-layer piezoelectric substrate according to another embodiment. The surface acoustic wave device 80 is like the surface acoustic wave device 70 of FIG. 7, except that a temperature compensating layer 72 is disposed between the support substrate 12 and the thermally conductive layer 14 in the surface acoustic wave device 80. As illustrated in FIG. 8, the thermally conductive layer 14 and the support substrate 12 can be in physical contact with opposing sides of the temperature compensating layer 72.

FIG. 9 illustrates a cross section of a surface acoustic wave device 90 with a temperature compensated multi-layer piezoelectric substrate according to another embodiment. The surface acoustic wave device 90 is like the surface acoustic wave device 70 of FIG. 7, except that the thermally conductive layer 14 is disposed between two temperature compensating layers 72 and 94. The temperature compensating layers 72 and 94 can be silicon dioxide layers. As illustrated in FIG. 9, the temperature compensating layers 72 and 94 can be in physical contact with opposing sides of the thermally conductive layer 14.

Figure 10:
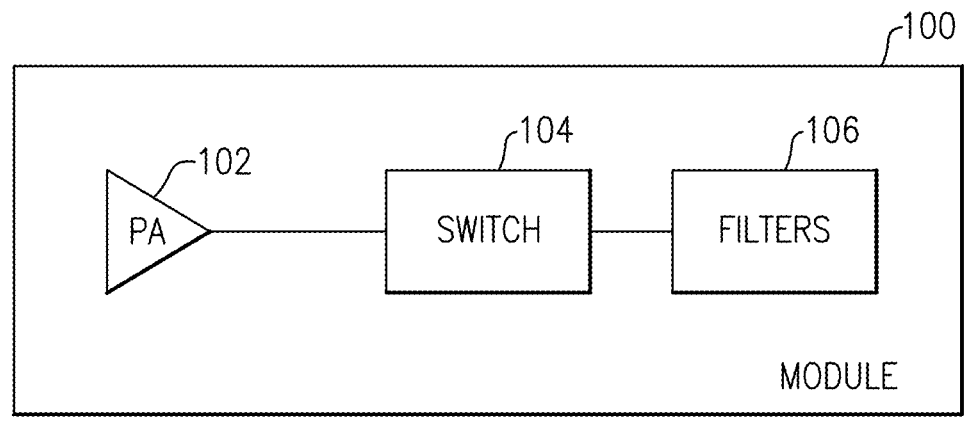
FIG. 10 is a schematic block diagram of a module that includes a power amplifier, a switch, and filters in accordance with one or more embodiments.
Figure 11:
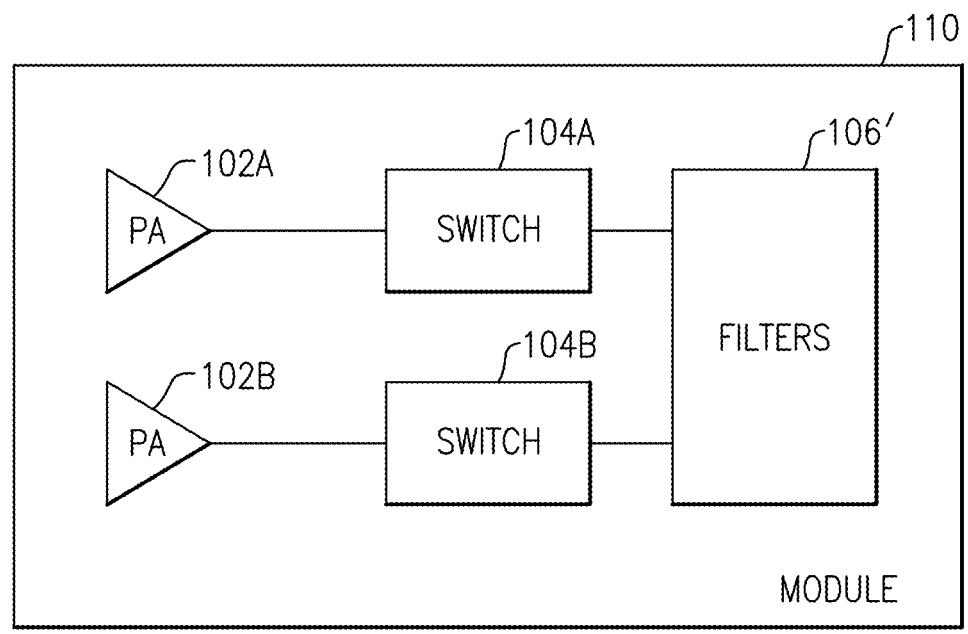
FIG. 11 is a schematic block diagram of a module that includes power amplifiers, switches, and filters in accordance with one or more embodiments.
Figure 12:
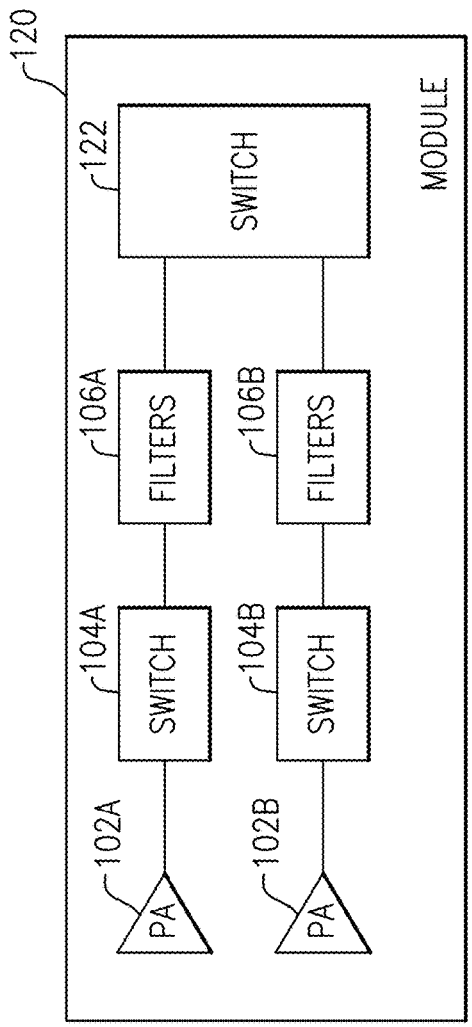
FIG. 12 is a schematic block diagram of a module that includes power amplifiers, switches, filters in accordance with one or more embodiments, and an antenna switch.

The acoustic wave devices discussed herein can be implemented in a variety of packaged modules. Some example packaged modules will now be discussed in which any suitable principles and advantages of the acoustic wave devices discussed herein can be implemented. FIGS. 10, 11, and 12 are schematic block diagrams of illustrative packaged modules according to certain embodiments. Any suitable combination of features of these embodiments can be combined with each other.

FIG. 10 is a schematic block diagram of a module 100 that includes a power amplifier 102, a switch 104, and filters 106 in accordance with one or more embodiments. The module 100 can include a package that encloses the illustrated elements. The power amplifier 102, the switch 104, and the filters 106 can be disposed on a common packaging substrate. The packaging substrate can be a laminate substrate, for example. The switch 104 can be a multi-throw radio frequency switch. The switch 104 can electrically couple an output of the power amplifier 102 to a selected filter of the filters 106. The filters 106 can include any suitable number of acoustic wave filters. One or more of the acoustic wave filters of the filters 106 can be implemented in accordance with any suitable principles and advantages of the acoustic wave devices discussed herein.

FIG. 11 is a schematic block diagram of a module 110 that includes power amplifiers 102A and 102B, switches 104A and 104B, and filters 106' in accordance with one or more embodiments. The module 110 is like the module 100 of FIG. 10, except that the module 110 includes an additional power amplifier 102B and an additional switch 104B and the filters 106' are arranged to filter signals for the signals paths associated with a plurality of power amplifiers 102A and 102B. The different signal paths can be associated with different frequency bands and/or different modes of operation (e.g., different power modes, different signaling modes, etc.).

FIG. 12 is a schematic block diagram of a module 120 that includes power amplifiers 102A and 102B, switches 104A and 104B, and filters 106A and 106B in accordance with one or more embodiments, and an antenna switch 122. The module 120 is like the module 110 of FIG. 11, except the module 120 includes an antenna switch 122 arranged to selectively couple a signal from the filters 106A or the filters 106B to an antenna node. The filters 106A and 106B can correspond to the filters 106' of FIG. 11.

Figure 13:
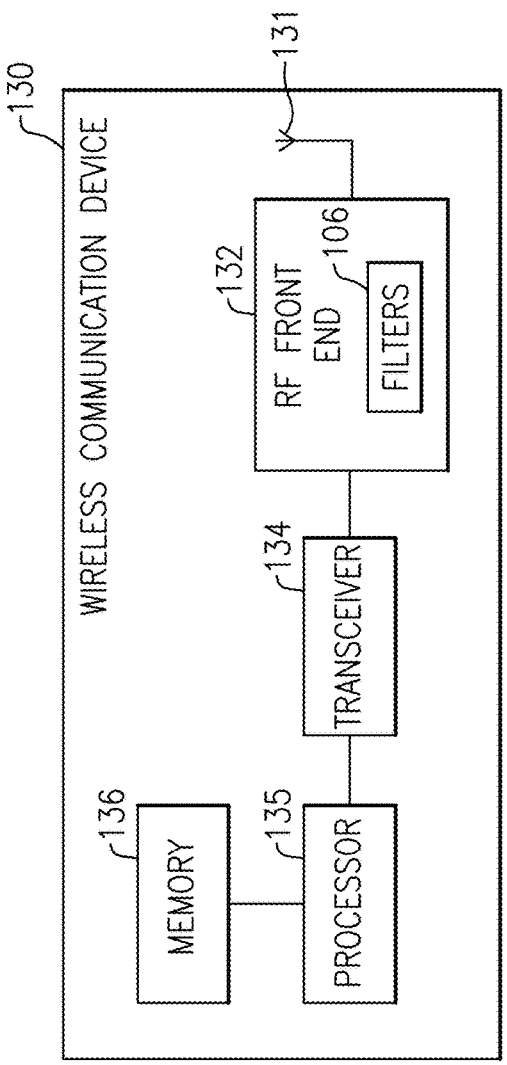
FIG. 13 is a schematic block diagram of a wireless communication device that includes filters in accordance with one or more embodiments.

FIG. 13 is a schematic block diagram of a wireless communication device 130 that includes filters 106 in accordance with one or more embodiments. The wireless communication device 130 can be any suitable wireless communication device. For instance, a wireless communication device 130 can be a mobile phone, such as a smart phone. As illustrated, the wireless communication device 130 includes an antenna 131, an RF front end 132, a transceiver 134, a processor 135, and a memory 136. The antenna 131 can transmit RF signals provided by the RF front end 132. The antenna 131 can provide received RF signals to the RF front end 132 for processing.

The RF front end 132 can include one or more power amplifiers, one or more low noise amplifiers, one or more RF switches, one or more receive filters, one or more transmit filters, one or more duplexers, or any suitable combination thereof. The RF front end 132 can transmit and receive RF signals associated with any suitable communication standards. Any of the surface acoustic wave devices discussed herein can be implemented in the RF front end 132.

The transceiver 134 can provide RF signals to the RF front end 132 for amplification and/or other processing. The transceiver 134 can also process an RF signal provided by a low noise amplifier of the RF front end 132. The transceiver 134 is in communication with the processor 135. The processor 135 can be a baseband processor. The processor 135 can provide any suitable baseband processing functions for the wireless communication device 130. The memory 136 can be accessed by the processor 135. The memory 136 can store any suitable data for the wireless communication device 130.

Although example embodiments may be discussed with filters for illustrative purposes, any suitable the principles and advantages disclosed herein can be implement in a multiplexer that includes a plurality of filters coupled together at a common node. Examples of multiplexers include but are not limited to a duplexer with two filters coupled together at a common node, a triplexer with three filters coupled together at a common node, a quadplexer with four filters coupled together at a common node, a hexaplexer with six filters coupled together at a common node, an octoplexer with eight filters coupled together at a common node, or the like. One or more filters of a multiplexer can include a multi-layer piezoelectric substrate surface acoustic wave resonator in accordance with any suitable principles and advantages disclosed herein.

Any of the principles and advantages discussed herein can be applied to other systems, modules, chips, surface acoustic wave devices, filters, duplexers, multiplexers, wireless communication devices, and methods not just to the systems, modules, filters, multiplexers, wireless communication devices, and methods described above. The elements and operations of the various embodiments described above can be combined to provide further embodiments. Any of the principles and advantages discussed herein can be implemented in association with radio frequency circuits configured to process signals in a frequency range from about 30 kilohertz (kHz) to 300 gigahertz (GHz), such as in a range from about 450 megahertz (MHz) to 6 GHz. For instance, any of the filters discussed herein can filter signals have a frequency in a range from about 450 MHz to 6 GHz. In some instances, filter that includes an acoustic wave resonator according to an embodiment can filter RF signals at frequencies up to and including millimeter wave frequencies.

Aspects of this disclosure can be implemented in various electronic devices. Examples of the electronic devices can include, but are not limited to, consumer electronic products, parts of the consumer electronic products such as chips and/or packaged radio frequency modules, electronic test equipment, uplink wireless communication devices, personal area network communication devices, etc. Examples of the consumer electronic products can include, but are not limited to, a mobile phone such as a smart phone, a wearable computing device such as a smart watch or an ear piece, a telephone, a television, a computer monitor, a computer, a router, a modem, a hand-held computer, a laptop computer, a tablet computer, a personal digital assistant (PDA), a vehicular electronics system such as an automotive electronics system, a microwave, a refrigerator, a stereo system, a digital music player, a camera such as a digital camera, a portable memory chip, a household appliance, etc. Further, the electronic devices can include unfinished products.

Conditional language used herein, such as, among others, "can," "could," "might," "may," "e.g.," "for example," "such as" and the like, unless specifically stated otherwise or otherwise understood within the context as used, is generally intended to convey that certain embodiments include, while other embodiments do not include, certain features, elements and/or states. The word "coupled," as generally used herein, refers to two or more elements that may be either directly coupled to each other, or coupled by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application.

While certain embodiments have been described, these embodiments have been presented by way of example only, and are not intended to limit the scope of the disclosure. Indeed, the novel devices, chips, methods, apparatus, and systems described herein may be embodied in a variety of other forms. Furthermore, various omissions, substitutions and changes in the form of the methods, apparatus, and systems described herein may be made without departing from the spirit of the disclosure. For example, circuit blocks described herein may be deleted, moved, added, subdivided, combined, and/or modified. Each of these circuit blocks may be implemented in a variety of different ways. The accompanying claims and their equivalents are intended to cover any such forms or modifications as would fall within the scope and spirit of the disclosure.

What is claimed is:

1. A filter with a multi-layer substrate with heat dissipation, the filter comprising an acoustic wave device that includes:
    a support substrate;
    a piezoelectric layer;
    an interdigital transducer electrode on the piezoelectric layer; and
    a thermally conductive layer configured to dissipate heat associated with the acoustic wave device, the thermally conductive layer having a higher thermal conductivity than the support substrate, the thermally conductive layer being disposed between the support substrate and the piezoelectric layer, and the thermally conductive layer having a thickness that is greater than 10 nanometers, the acoustic wave device is configured to generate an acoustic wave having a wavelength of λ, and the thickness of the thermally conductive layer being less than 0.03λ; the filter being arranged as a band pass filter configured to receive and filter a radio frequency signal having a frequency in a range from 450 megahertz to 6 gigahertz.

2. The filter of claim 1 wherein the support substrate is a quartz substrate.

3. The filter of claim 2 wherein the piezoelectric layer is a lithium tantalate layer.

4. The filter of claim 1 wherein the piezoelectric layer has a higher thermal conductivity than the support substrate.

5. The filter of claim 1 wherein the support substrate includes at least one of silicon, aluminum nitride, silicon nitride, magnesium oxide spinel, magnesium oxide crystal, or diamond.

6. The filter of claim 1 wherein the acoustic wave device further includes a temperature compensating layer having a positive temperature coefficient of frequency, the temperature compensating layer being disposed between the piezoelectric layer and the support substrate.

7. The filter of claim 6 wherein the temperature compensating layer is a silicon dioxide layer.

8. The filter of claim 6 wherein the temperature compensating layer is disposed between the piezoelectric layer and the thermally conductive layer.

9. The filter of claim 6 wherein the temperature compensating layer is disposed between the thermally conductive layer and the support substrate.

10. The filter of claim 1 wherein the acoustic wave device further includes a first temperature compensating layer disposed between the piezoelectric layer and the thermally conductive layer, and a second temperature compensating layer disposed between the thermally conductive layer and the support substrate.

11. The filter of claim 1 wherein the thermally conductive layer includes a metal.

12. The filter of claim 1 wherein the thermally conductive layer has a thermal conductivity in a range from 140 W/mK to 425 W/mK.

13. The filter of claim 1 wherein the thermally conductive layer has a thermal conductivity that is at least 10 times a thermal conductivity of the piezoelectric layer.

14. The filter of claim 1 wherein the filter is arranged such that a maximum surface temperature of a filter chip that includes the filter is less than 60° Celsius during operation of the filter.

15. The filter of claim 1 wherein the acoustic wave device is a surface acoustic wave device, and the acoustic wave is a surface acoustic wave.

16. The filter of claim 1 wherein the thermally conductive layer has a first side in physical contact with the support substrate and a second size in physical contact with the piezoelectric layer.

17. The filter of claim 1 wherein the thickness of the thermally conductive layer is less than 120 nanometers.

18. A surface acoustic wave device with a temperature compensated multi-layer substrate with heat dissipation, the surface acoustic wave device comprising:
    a support substrate;
    a piezoelectric layer;
    an interdigital transducer electrode on the piezoelectric layer;
    a thermally conductive layer configured to dissipate heat associated with the surface acoustic wave device, the thermally conductive layer having a higher thermal conductivity than the support substrate, the thermally conductive layer being disposed between the support substrate and the piezoelectric layer, and the thermally conductive layer having a thickness that is greater than 10 nanometers and less than 120 nanometers; and
    a temperature compensating layer having a positive temperature coefficient of frequency, the temperature compensating layer and the interdigital transducer electrode being disposed on opposite sides of the piezoelectric layer, the surface acoustic wave device being configured to generate a surface acoustic wave having a wavelength of λ.

19. The surface acoustic wave device of claim 18 wherein the piezoelectric layer is a lithium tantalate layer and the support substrate is a quartz layer.

20. A radio frequency module comprising:
    a radio frequency switch configured to pass a radio frequency signal having a frequency in a range from 450 megahertz to 6 gigahertz;
    a filter with a multi-layer substrate with heat dissipation, the filter including an acoustic wave device that includes a support substrate, a piezoelectric layer, an interdigital transducer electrode on the piezoelectric layer, and a thermally conductive layer configured to dissipate heat associated with the acoustic wave device, the thermally conductive layer having a higher thermal conductivity than the support substrate, the thermally conductive layer being disposed between the support substrate and the piezoelectric layer, and the thermally conductive layer having a thickness that is greater than 10 nanometers, the acoustic wave device is configured to generate an acoustic wave having a wavelength of $\lambda$, the thickness of the thermally conductive layer being less than $0.03\lambda$, and the filter being arranged as a band pass filter configured to receive and filter the radio frequency signal; and a package enclosing the filter and the radio frequency switch.

* * * * *

UNITED STATES PATENT AND TRADEMARK OFFICE
CERTIFICATE OF CORRECTION

PATENT NO. : 11,050,406 B2
APPLICATION NO. : 16/414622
DATED : June 29, 2021
INVENTOR(S) : Keiichi Maki et al.

Page 1 of 1

It is certified that error appears in the above-identified patent and that said Letters Patent is hereby corrected as shown below:

In the Claims

In Column 14, Claim 16, Line 27, delete "size" and insert --side--.

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*